United States Patent
Rittman (10) Patent No.: US 6,782,524 B2
(45) Date of Patent: Aug. 24, 2004

(54) PHOTOMASK AND INTEGRATED CIRCUIT MANUFACTURED BY AUTOMATICALLY CORRECTING DESIGN RULE VIOLATIONS IN A MASK LAYOUT FILE

(75) Inventor: Dan Rittman, Foster City, CA (US)

(73) Assignee: DuPont Photomasks, Inc., Round Rock, TX (US)

( * ) Notice: Subject to any disclaimer, the term of this patent is extended or adjusted under 35 U.S.C. 154(b) by 38 days.

(21) Appl. No.: 10/161,527

(22) Filed: Jun. 3, 2002

(65) Prior Publication Data

US 2002/0152453 A1 Oct. 17, 2002

Related U.S. Application Data

(63) Continuation-in-part of application No. 09/401,152, filed on Sep. 22, 1999, now abandoned.

(51) Int. Cl.[7] .............................. G06F 17/50; G06F 9/45
(52) U.S. Cl. ............................................. 716/19; 716/5
(58) Field of Search ............................. 716/4, 5, 9, 19, 716/20

(56) References Cited

U.S. PATENT DOCUMENTS

| | | | | |
|---|---|---|---|---|
| 5,689,433 A | | 11/1997 | Edwards ........................ 716/2 |
| 5,820,950 A | * | 10/1998 | Wang ........................... 428/14 |
| 6,035,108 A | | 3/2000 | Kikuchi ........................ 716/2 |
| 6,167,555 A | | 12/2000 | Lakos ........................... 716/3 |
| 6,317,864 B1 | | 11/2001 | Kikuchi et al. ................ 716/11 |
| 6,321,367 B1 | * | 11/2001 | Chun et al. ..................... 716/8 |
| 6,425,112 B1 | * | 7/2002 | Bula et al. ...................... 716/5 |
| 6,457,163 B1 | * | 9/2002 | Yang ............................ 716/8 |

OTHER PUBLICATIONS

Hsiao et al.; A rule–based compactor for VLSI/CAD mask layout; IEEE Computer software & Applications Conf.; pp. 35–42; Oct. 1988.

Mehranfar; "A technology–independent approach to custom analog cell generation"; IEEE J. Solid State Ckts; pp. 386–393; Mar. 1991.

U.S. patent application Ser. No. 10/159,566 entitled *System and Method for Correcting Design Rule Violations in a Mask Layout File* filed by Rittman on May 31, 2002; 38 pages.

* cited by examiner

*Primary Examiner*—Leigh M. Garbowski
*Assistant Examiner*—Brandon Bowers
(74) *Attorney, Agent, or Firm*—Baker Botts L.L.P.

(57) ABSTRACT

A photomask and method for eliminating design rule violations from the photomask are disclosed. A photomask includes a substrate and a patterned layer formed on at least a portion of the substrate. The patterned layer may be formed using a mask pattern file created by comparing a feature dimension in a mask layout file with a design rule in a technology file, identifying a design rule violation if the feature dimension is less than the design rule and automatically correcting the identified design rule violation in the mask layout file.

20 Claims, 3 Drawing Sheets

PHOTOMASK AND INTEGRATED CIRCUIT MANUFACTURED BY AUTOMATICALLY CORRECTING DESIGN RULE VIOLATIONS IN A MASK LAYOUT FILE

RELATED APPLICATIONS

This application is a continuation-in-part of U.S. patent application Ser. No. 09/401,152, filed Sep. 22, 1999 now abandoned and entitled "AUTOMATIC FIX (CORRECTION) OF DESIGN RULE VIOLATIONS THROUGHOUT GLOBAL MASK LAYOUT DATABASE (IC LAYOUT) COMPUTER SOFTWARE."

TECHNICAL FIELD OF THE INVENTION

This invention relates in general to the field of photolithography, and more particularly to a photomask and method for eliminating design rule violations from the photomask.

BACKGROUND OF THE INVENTION

Over the past several years, the number of transistors in a semiconductor device has increased dramatically. Due to this increase, the time to design and manufacture semiconductor devices has also increased.

A typical semiconductor design process includes numerous steps. Initially, a circuit designer prepares a schematic diagram that includes logical connections between logic elements that together form an integrated circuit. The schematic diagram is then tested to verify that the logic elements and associated logical connections perform a desired function. Once the circuit is verified, the schematic diagram is converted into a mask layout database that includes a series of polygons. The polygons may represent the logic elements and the logical connections contained in the schematic diagram. The mask layout database is then converted into multiple photomasks, also know as masks or reticles, that may be used to image different layers of the integrated circuit on to a semiconductor wafer.

Typically, the mask layout database is created manually by a layout designer or automatically by a synthesis tool. Once the mask layout database is complete, spacing between the polygons on the same layer is compared to the minimum allowable spacing that is included in a technology file for a desired manufacturing process. This comparison may identify design rule violations if the spacing between the polygons or the dimensions of the polygons in the mask layout database is less than the corresponding minimum allowable design rule in the technology file.

Today, any design rule violations in the mask layout database are corrected manually by a layout designer. The layout designer typically finds each violation and manually corrects the violations by moving polygons associated with the violations. During the correction process, the layout designer may create new design rule violations and, therefore, the correction process may be repeated until the mask layout database does not include any design rule violations. The process of iteratively correcting the design rule violations may take several hours or even days to complete and can increase the time needed to design the integrated circuit. The additional time required to complete layout may also delay the production of a photomask set used to fabricate the integrated circuit.

SUMMARY OF THE INVENTION

In accordance with the present invention, the disadvantages and problems associated with eliminating design rule violations on a photomask have been substantially reduced or eliminated. In a particular embodiment, a photomask is formed by using a mask pattern file created by automatically correcting a design rule violation in a mask layout file.

In accordance with one embodiment of the present invention, a photomask includes a patterned layer formed on at least a portion of a substrate. The patterned layer may be formed using a mask pattern file that is created by comparing a feature dimension in a mask layout file with a design rule in a technology file. If the feature dimension is less than the design rule, a design rule violation is identified and automatically corrected in the mask layout file.

In accordance with another embodiment of the present invention, an integrated circuit includes a plurality of interconnect layers, including but not limited to n-well, p-well, diffusion, polysilicon and metal, and a plurality of contact layers that provide electrical connections between the respective interconnect layers. The interconnect and contact layers may be formed using a plurality of photomasks that are created by comparing a feature dimension in a mask layout file with a design rule in a technology file. If the feature dimension is less than the design rule, a design rule violation is identified and automatically corrected in the mask layout file. A plurality of mask pattern files that correspond to the interconnect and contact layers are generated from the mask layout file.

Important technical advantages of certain embodiments of the present invention include a design rule fix (DRF) tool that reduces the design time for an integrated circuit. A design rule check (DRC) tool checks a mask layout file for design rule violations and identifies any violations in an output file. If the mask layout file contains design rule violations, the DRF tool reads the coordinates of the violation from the output file and automatically adjusts a feature dimension associated with the violation until the feature dimension is equal to or greater than a minimum design rule for a desired manufacturing process. The time needed to verify the mask layout file may be substantially reduced because the DRF tool simultaneously identifies and eliminates the design rule violations in the mask layout file.

Another important technical advantage of certain embodiments of the present invention includes a DRF tool that reduces the size and increases the density of features in a mask layout file. In addition to correcting design rule violations, the DRF tool determines if the spacing between polygons in the mask layout file is greater than the corresponding minimum design rules in a technology file and reduces the spacing until it is approximately equal to the minimum design rule. The density of the mask layout file, therefore, may be increased, which also increases the number of integrated circuits that may be fabricated on a wafer.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments of the invention and its advantages are best understood by reference to FIGS. 1 through 6 of the drawings, like numerals being used for like and corresponding parts of the various drawings.

As the number of transistors on an integrated circuit continues to increase, the design process for the integrated circuit becomes more complex. For example, an increasing number of transistors may require additional layers to form the integrated circuit on a semiconductor wafer. Each layer associated with the integrated circuit may include a design rule for the layer in a desired manufacturing process. The number of design rules for the desired manufacturing process, therefore, increases with the number of layers formed on the semiconductor wafer.

A design rule typically defines the minimum or maximum allowable dimension for a feature fabricated on a specific layer. For example, an integrated circuit may include, among other layers, a polysilicon layer that forms the transistor gates, a metal layer that forms interconnects between transistors and a contact or via layer that connects the polysilicon layer to the metal layer. Each layer typically has one or more design rules associated with features in a mask layout file that are formed on the specific layer. The metal layer may include design rules for a minimum allowable spacing between two adjacent metal features, a minimum width of a metal feature and a minimum and/or maximum length of a metal feature. The polysilicon and contact layers may include similar design rules where the minimum or maximum allowable dimensions are unique to that layer.

Figure 1:
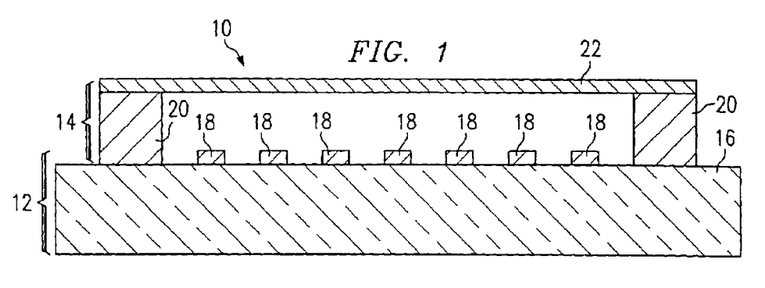
FIG. 1 illustrates a cross-sectional view of a photomask assembly manufactured in accordance with teachings of the present invention.

FIG. 1 illustrates a cross-sectional view of photomask assembly 10 manufactured using a mask layout file. Photomask assembly 10 includes photomask 12 coupled to pellicle assembly 14. Substrate 16 and patterned layer 18 form photomask 12, otherwise known as a mask or reticle, that may have a variety of sizes and shapes, including but not limited to round, rectangular, or square. Photomask 12 may also be any variety of photomask types, including, but not limited to, a one-time master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM), an optical proximity correction (OPC) mask or any other type of mask suitable for use in a lithography system.

Photomask 12 includes patterned layer 18 formed on substrate 16 that, when exposed to electromagnetic energy in a lithography system, projects a pattern onto a surface of a semiconductor wafer (not expressly shown). Substrate 16 may be a transparent material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 10 nanometers (nm) and approximately 450 nm. In an alternative embodiment, substrate 16 may be a reflective material such as silicon or any other suitable material that reflects greater than approximately fifty percent (50%) of incident light having a wavelength between approximately 10 nm and 450 nm.

Patterned layer 18 may be a metal material such as chrome, chromium nitride, a metallic oxy-carbo-nitride (M—O—C—N), where the metal is selected from the group consisting of chromium, cobalt, iron, zinc, molybdenum, niobium, tantalum, titanium, tungsten, aluminum, magnesium and silicon, and any other suitable material that absorbs electromagnetic energy with wavelengths in the ultraviolet (UV) range, deep ultraviolet (DUV) range, vacuum ultraviolet (VUV) range and extreme ultraviolet range (EUV). In an alternative embodiment, patterned layer 18 may be a partially transmissive material, such as molybdenum silicide (MoSi), which has a transmissivity of approximately one percent to approximately thirty percent (30%) in the UV, DUV, VUV and EUV ranges.

Frame 20 and pellicle film 22 may form pellicle assembly 14. Frame 20 is typically formed of anodized aluminum, although it could alternatively be formed of stainless steel, plastic or other suitable materials. Pellicle film 22 may be a thin film membrane formed of a material such as nitrocellulose, cellulose acetate, an amorphous fluoropolymer, such as TEFLON® AF manufactured by E. I. du Pont de Nemours and Company or CYTOP® manufactured by Asahi Glass, or another suitable film that is transparent to wavelengths in the UV, DUV, EUV and VUV ranges. Pellicle film 22 may be prepared by a conventional technique such as spin casting.

Pellicle film 22 protects photomask 12 from dust particles by ensuring that the dust particles remain a defined distance away from photomask 12. This may be especially important in a lithography system. During a lithography process, photomask assembly 10 is exposed to electromagnetic energy produced by a radiant energy source within the photolithography system. The electromagnetic energy may include light of various wavelengths, such as wavelengths approximately between the I-line and G-line of a Mercury arc lamp, or DUV, VUV or EUV light. In operation, pellicle film 22 is designed to allow a large percentage of the electromagnetic energy to pass through it. Dust particles collected on pellicle film 22 will likely be out of focus at the surface of the wafer being processed and, therefore, the exposed image on the wafer should be clear. Pellicle film 22 formed in accordance with the teachings of the present invention may be satisfactorily used with all types of electromagnetic energy and is not limited to lightwaves as described in this application.

Photomask 12 may be formed from a photomask blank using standard lithography processes. In a lithography process, a mask pattern file that includes data for patterned layer 18 may be generated from a mask layout file. The mask layout file may include polygons that represent transistors and electrical connections for an integrated circuit. The polygons in the mask layout file may further represent different layers of the integrated circuit when it is fabricated on a semiconductor wafer. For example, a transistor may be formed on a semiconductor wafer from a diffusion layer and a polysilicon layer. The mask layout file, therefore, may include one or more polygons drawn on the diffusion layer (not expressly shown) and one or more polygons drawn on the polysilicon layer (not expressly shown). The polygons for each layer may be converted into a mask pattern file that represents one layer of the integrated circuit. Each mask pattern file may be used to generate a photomask for the specific layer.

The desired pattern may be imaged into a resist layer of the photomask blank using a laser, electron beam or X-ray lithography tool. In one embodiment, a laser lithography tool uses an Argon-Ion laser that emits light having a wavelength of approximately 364 nanometers (nm). In alternative embodiments, the laser lithography tool uses lasers emitting light at wavelengths from approximately 150 nm to approximately 300 nm. Photomask 12 may be fabricated by developing and etching exposed areas of the resist layer to create a pattern, etching the portions of patterned layer 18 not covered by resist, and removing the undeveloped resist to create patterned layer 18 over transparent substrate 16. Photomask 12 may then be placed into a lithography system to project an image onto the surface of a semiconductor wafer. A separate photomask is used for each individual layer of the integrated circuit. For example, one photomask may be used to create the diffusion regions on a wafer and another photomask may be used to create a layer of polysilicon over the diffusion regions.

Figure 2:
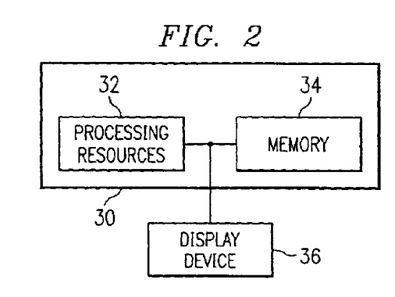
FIG. 2 illustrates a block diagram of a computer system for correcting design rule violations in a mask layout file in accordance with teachings of the present invention.

FIG. 2 illustrates a block diagram of computer system 30 that may be used to correct design rule violations in a mask layout file. In the illustrated embodiment, computer system 30 includes processing resource 32, memory 34 and display device 36. Processing resource 32 may be a microprocessor, a microcontroller, a digital signal processor (DSP) or any other digital or analog circuitry configured to execute processing instructions stored in memory 34. Memory 34 may be random access memory (RAM), electrically erasable programmable read-only memory (EEPROM), a PCMCIA card, flash memory, or any suitable selection and/or array of volatile or non-volatile memory that retains data after the power to computer system 30 is turned off. Display device 36 may be a liquid crystal device, cathode ray tube, or other display device suitable for creating graphic images and alphanumeric characters recognizable to a user.

In operation, processing instructions are stored in memory 34. Processing resource 32 accesses memory 34 to retrieve the processing instructions and perform various functions included in the processing instructions. In one embodiment, the processing instructions may include a design rule fix (DRF) tool. The DRF tool may use any commercially available design rule check (DRC) tool to compare feature dimensions in a mask layout file to design rules for a desired manufacturing process. The design rules may be included in a technology file that is used by the DRC tool and may represent the minimum and/or maximum allowable feature dimensions (e.g., spaces between polygons and dimensions of polygons) for the desired manufacturing process. If the feature dimensions in the mask layout file are greater than or equal to the minimum design rules, the DRC tool may generate an output file that indicates that the mask layout file does not include any design rule violations.

However, if at least one feature dimension in the mask layout file is less than a corresponding design rule in the technology file, the DRC tool may generate an output file that contains any identified design rule violations. The output file may be used by the DRF to locate the coordinates of the polygons in the mask layout file that are associated with the design rule violations. The DRF tool may automatically adjust the feature dimension of spaces between polygons or the length and/or width of the polygons until the feature dimension is approximately equal to or greater than the corresponding design rule in the technology file.

In one embodiment, changes to the mask layout file may create new design rule violations that are associated with polygons surrounding the edited polygons. The DRF tool, therefore, analyzes any potential changes to the mask layout file to ensure that no additional design rule violations are created. Once the DRF tool determines that the changes to the mask layout file will not create additional design rule violations, the DRF tool repositions the polygons associated with the original design rule violations. In one embodiment, the DRF tool may reposition one or more edges of the polygons in the mask layout file. The DRF tool also maintains connectivity in the mask layout file by adding polygons to any features that may be affected when the polygons associated with the design rule violation are repositioned in the mask layout file. The DRF tool individually locates and corrections all of the design rule violations identified in the output file until the mask layout file is free of design rule violations.

In one embodiment, the changes to the polygons associated with the design rule violations may increase the size of the mask layout file. Once the design rule violations have been removed, the DRF tool determines if the polygons in the mask layout file may be compacted. The DRF tool first compares the spacings between the polygons in the mask layout file to the corresponding design rule in the technology file. If any of the spacings are greater than the corresponding design rules, the design tool attempts to reduce the distance between the polygons such that the spacing between the polygons is approximately equal to the corresponding minimum feature spacing contained in the technology file. Since the DRF tool uses the design rules to compact the mask layout file, no design rule violations are created and the mask layout file has an increased density.

In some embodiments, the processing instructions for correcting design rule violations in a mask layout file may be encoded in computer-usable media. Such computer-usable media may include, without limitation, storage media such as floppy disks, hard disks, CD-ROMS, DVDS, read-only memory, and random access memory; as well as communications media such wires, optical fibers, microwaves, radio waves, and other electromagnetic or optical carriers.

Figure 3:
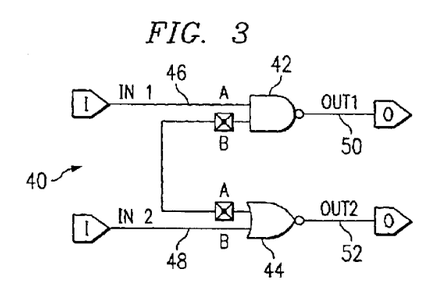
FIG. 3 illustrates a schematic diagram of an example integrated circuit formed in accordance with teachings of the present invention.

FIG. 3 illustrates schematic diagram 40 of an integrated circuit that includes NAND 42 and NOR 44. NAND 42 may include two inputs, labeled a and b and NOR 44 may include two inputs, labeled a and b. In the illustrated embodiment, node 46, labeled in1, is connected to input a of NAND 42, node 48, labeled in2, is connected to input b of NOR 44, and input b of NAND 42 is connected to input a of NOR 44. Output 50 of NAND 22 is labeled out1 and output 52 of NOR 34 is labeled out2. In another embodiment, NAND 42 and NOR 44 may have more than two inputs and the circuit may be connected in any suitable way. In other embodiments, an integrated circuit may include other logical elements, including, but not limited to, inverters, AND gates, OR gates, XOR gates and XNOR gates, and complex circuits, such as adders, latches, flip-flops, multiplexers, registers, memory cells, programmable logic arrays (PLAs) and any other type of circuitry that may be used to form an integrated circuit.

In order to verify that the logic elements and associated connections perform the desired function, a netlist may be generated of the integrated circuit in schematic diagram 40. The netlist may include a list of transistors, such as P-MOSFETS and N-MOSFETS that form the integrated circuit, nodes associated with the integrated circuit (e.g., nodes 26 and 28 and outputs 30 and 32) and the logical connections between the nodes. A verification tool may be used to verify that the connections are correct and the verified netlist may be stored in memory 14 for use by other applications.

Figure 4:
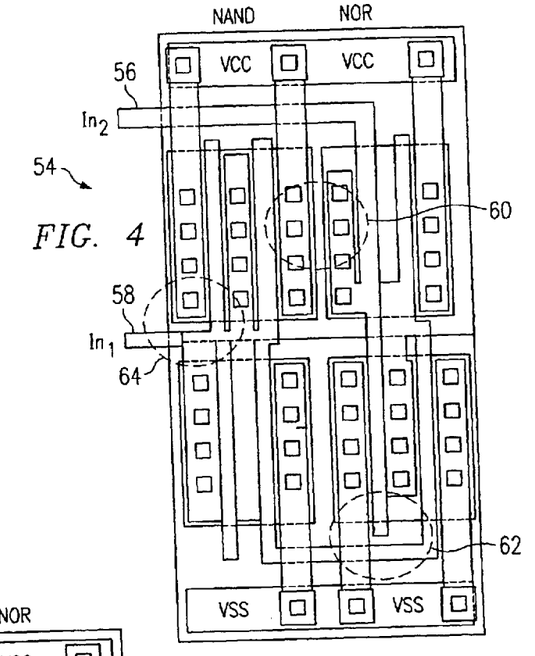
FIG. 4 illustrates a layout view of the example integrated circuit of FIG. 3 after a design rule verification tool checks feature dimensions in a mask layout file.

FIG. 4 illustrates layout block 54 that represents the integrated circuit shown in schematic diagram 40 of FIG. 3. Layout block 54 includes polygons that form NAND 42 and NOR 44. Node 56 corresponds to node 46 in schematic diagram 40 and node 58 corresponds to node 48 in schematic diagram 40. As shown, the integrated circuit is represented by polygons drawn on different layers, including but not limited to, n-well, p-well, diffusion, polysilicon, metal one contacts, metal one, metal two contacts, and metal two. In another embodiment, the integrated circuit may include the layers shown in FIG. 4 in addition to one or more polysilicon layers, one or more metal layers and any corresponding contact layers. Each layer may be separated by an insulating material, such as silicon dioxide.

A mask layout file may be generated from layout block 54 and checked for design rule violations by a DRF tool that interfaces with any commercially available DRC tool. The DRC tool may measure dimensions of polygons and spaces between polygons in the mask layout file to determine if any feature dimensions are less than minimum design rules for a desired manufacturing process. In one embodiment, the DRC tool may measure the space between polygons by determining the distance between the edges of two or more polygons. In another embodiment, the DRC tool may measure the dimensions of a polygon by determining the distance between opposite edges of the polygon. The DRC tool may then generate an output file indicating that layout block 54 is either free of design rule violations or has design rule violations associated with certain polygons. The output file may be used by a computer aided design (CAD) tool executing on computer system 30 to display the location of any violations within layout block 54 to a user on display device 36.

As illustrated in FIG. 4, layout block 54 may contain at least three design rule violations. Diffusion violation 60 indicates that the distance between the polygons representing the respective p-type diffusion areas for NAND 42 and NOR 44 is less than the minimum p-type diffusion spacing contained in the technology file. Polysilicon violation 62 indicates that the distance between the polygons representing the respective polysilicon gates for NAND 42 and NOR 44 is less than the minimum polysilicon spacing contained in the technology file. Metal violation 64 indicates that the distance between the polygons representing metal one connections in NAND 42 is less than the minimum metal one spacing contained in the technology file. Diffusion violation 60, polysilicon violation 62 and metal violation 64 may be shown in layout block 54 by highlighting, circling or identifying the design rule violation with any other suitable method. The identification method may include identifying all or a portion of the design rule violation.

Figure 5:
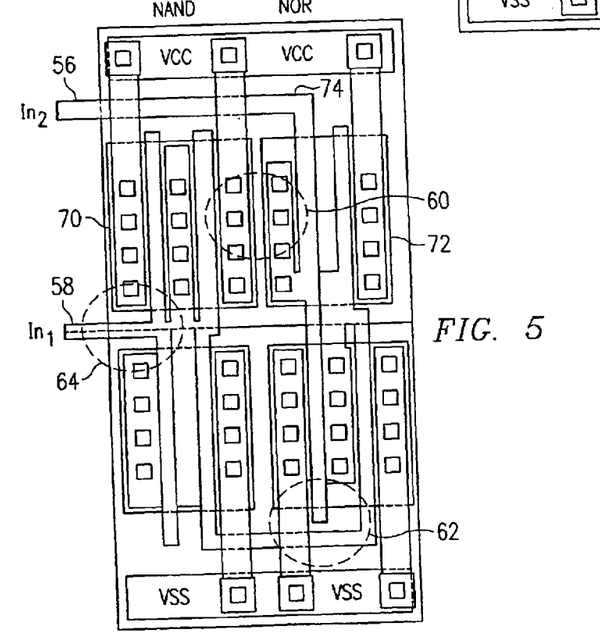
FIG. 5 illustrates a layout view of the example integrated circuit of FIG. 3 after correction of any design rule violations in a mask layout file.

FIG. 5 illustrates layout block 54 after the DRF tool has corrected any design rule violations in a mask layout file. After identifying any design rule violations in the mask layout file, the DRF tool begins the process of eliminating the identified design rule violations. The DRF tool uses the output file from the DRC tool to determine the coordinates in the mask layout file of a design rule violation. For example, the DRF tool may first uses the coordinates for diffusion violation 60 from the output file to locate diffusion violation 60 (as shown in FIG. 4) in the mask layout file. Once the DRF tool has located diffusion violation 60, the DRF tool corrects diffusion violation by increasing the distance between NAND diffusion 70 and NOR diffusion 72. In one embodiment, the DRF tool repositions the edges of either NAND diffusion 70 or NOR diffusion 72, in addition to moving any polygons (e.g., polysilicon 74 and the metal and contacts connected to NOR diffusion 72) associated with either diffusion area. In another embodiment, the DRF tool repositions the edges of both NAND diffusion 70 and NOR diffusion 72 and moves any other polygons associated with the diffusion areas.

In addition to correcting any design rule violations, the DRF tool also maintains the connectivity of electrical connections represented by the polygons in the mask layout file. For example, if the DRF tool moves NOR diffusion 72 away from NAND diffusion 70, the DRF tool must also move polysilicon 74. In order to simultaneously maintain the connectivity of node 56 and move polysilicon 74, the DRF tool may add polygons to polysilicon 74 in order to compensate for the increased feature spacing between NAND diffusion 70 and NOR diffusion 72. The additional polygons in polysilicon 74 may be added in order to avoid creating a break in node 56.

Once the DRF tool determines that the feature dimension of the space between NAND diffusion 70 and NOR diffusion 72 is approximately equal to or greater than the minimum spacing for p-type diffusion included in the technology file, the DRF tool corrects polysilicon violation 62 and metal violation 64. The DRF tool corrects polysilicon violation 62 and metal violation 64 using a method similar to the method described above in reference to diffusion violation 60. In one embodiment, DRF tool may simultaneously correct all design rule violations in the mask layout file.

The DRF tool also determines if changes to the feature dimensions of the spaces between polygons and/or the dimensions of the polygons associated with design rule violations created any new design rule violations and/or increased the size of layout block 54. The DRF tool then automatically eliminates any new design rule violations and reduces the distances between polygons in layout block 54 so that the features on each layer (e.g., metal, polysilicon or contacts) include the minimum spacing and/or width allowed by the desired manufacturing process.

In one embodiment, layout block 54 may be a subcell in a hierarchical design and may be repeated multiple times in a top-level cell. In this example, the DRF tool may identify a design rule violation in one instance of the subcell. Since each instance of the subcell may include identical polygons, a change to the polygons in one subcell may affect all instances of the subcell. The DRF tool, therefore, may correct the design rule violation in the one subcell and the design rule violation in all other instances will be globally corrected throughout the mask layout file. Once the design rule violation is corrected in the subcells, the DRF tool may check a top-level structure to determine if the changes caused any violations in the top-level structure. If the DRF tool identifies any violations in the top-level structure, the DRF tool corrects the violations at the top-level and then verifies that the corrections did not effect any of the subcells.

Figure 6:
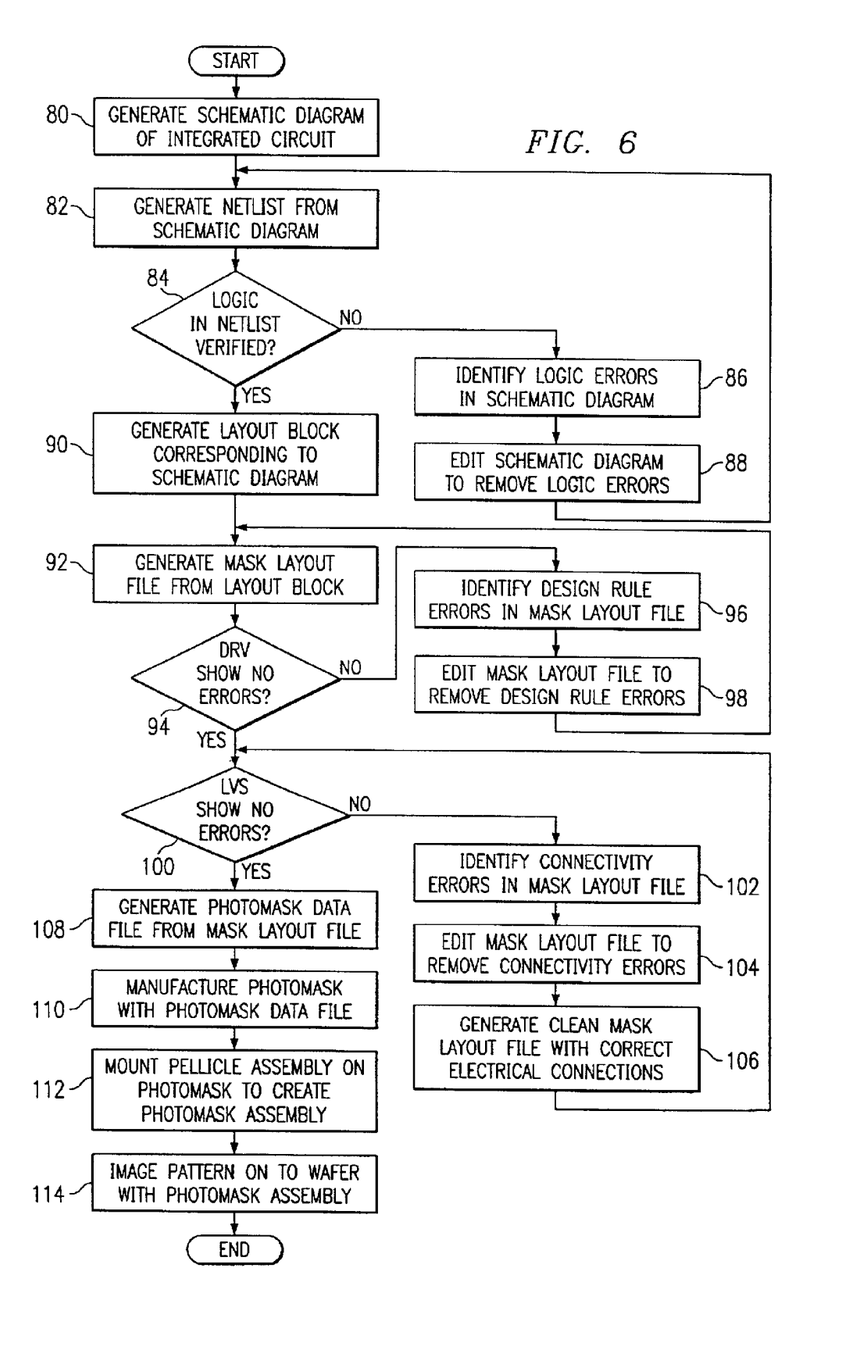
FIG. 6 illustrates a flow chart for one example of a method for correcting design rule violations in a mask layout file in accordance with teachings of the present invention.

FIG. 6 illustrates a flow chart of a method for correcting design rule violations in a mask layout file. Generally, a design rule fix (DRF) tool, that includes a commercially available design rule check (DRC) tool, compares feature dimensions (e.g., dimensions of polygons and/or spacing between polygons) in a mask layout file to corresponding design rules for a desired manufacturing process. If the mask layout file contains design rule violations, indicating that the feature dimensions the mask layout file are less than minimum design rules in a technology file, the DRF tool generates an output file that contains the design rule violations. The output file may be used by the DRF tool to automatically correct any design rule violations that were identified. The DRF tool may adjust the distance between polygons and/or modify dimensions of polygons associated with the design rule violations. The DRF tool also simultaneously maintains connectivity of any electrical connections that are affected by the modifications and compacts the mask layout file. The DRF tool may compact the mask layout file by using a minimization calculation to increase the density of the mask layout file and shifting the polygons to the minimum design rules for the desired manufacturing process.

At step 80, a circuit designer creates schematic diagram 40 for an integrated circuit. Schematic diagram 40 may be generated manually by the circuit designer or with a synthesis tool that creates a schematic diagram by using an input file, such as a high-level design language (HDL) file. The HDL file may include both behavioral descriptions and structural descriptions for the integrated circuit. Once schematic diagram 40 is complete, a netlist may be generated from schematic diagram 40 at step 82. The netlist may include definitions of the generic cell logic functions and the connections between the various logic functions. In one embodiment, the netlist may be a flat netlist that defines all of the logic and connections at one level. In another embodiment, the netlist may be a hierarchical netlist that contains top-level cells and one or more sub-cells that can be used in any of the top-level cells. The netlist may be generated from CAD tools developed by Cadence, Synopsis, Mentor Graphics or any other company that provides software and/or hardware for generating a netlist from a schematic diagram.

At step 84, the netlist may be tested by a verification tool to determine if schematic diagram 40 includes the correct circuits and logical connections to perform a desired function. If the netlist contains logic errors, the verification tool may generate an output file that contains a list of the logic errors at step 86. The circuit designer may use the output file to correct errors in the logic and/or errors in the connections between the logic in schematic diagram 40 at step 88. The corrections may be made manually by the circuit designer or the output file may be used by a synthesis tool to automatically correct the errors and insert the correct logical elements and/or connections. Once the corrections have been made, a clean netlist is generated for logic verification at step 82.

If the verification tool determines that the netlist does not contain any logic errors, layout block 54 that represents the integrated circuit shown in schematic diagram 40 is created at step 90. The layout block may be created manually by a layout designer using CAD tools developed by Cadence, Synopsis, Mentor Graphics, or any other company that develops integrated circuit layout tools, or automatically by a synthesis tool. Layout block 54 may include polygons located on different layers that form the transistors and electrical connections for the integrated circuit. The layers in layout block 54 may include, but are not limited to, n-well, p-well, diffusion, one or more polysilicon layers, any suitable number of metal layers and the associated contacts or vias that provide connections between the different layers.

When layout block 54 is complete, a mask layout file is generated at step 92. The mask layout file contains data regarding the geometry and interconnections of the integrated circuit represented in layout block 54. This data may be stored in the GDSII format, CIF format, DFII format, or any other suitable format for data that may describe the geometry and interconnections of integrated circuits. Similar to the schematic netlist, the mask layout file may be flat or hierarchical. In a hierarchical design, a top-level structure includes specific references to one or more levels of sub-cells. The references include all geometry and connectivity information that are contained within each of the subcells. Any top level structures and the associated subcells may also include local geometry and connectivity information that represent circuitry that is logically situated within the top level structure but not included in any referenced subcell.

Once the mask layout file has been generated, a DRC tool determines if there are any design rule violations at step 94. A design rule violation may include, but is not limited to, less than minimum spacing between polygons on the same or different layers in layout block 54 or less than the minimum and/or maximum dimensions for the polygons on the various layers. The DRC tool compares the spacing between polygons and/or dimensions of the polygons in the mask layout file with the corresponding design rules for a desired manufacturing process. If a design rule violation is identified, the DRC tool includes the design rule violation in an output file at step 96. In one embodiment, the output file may be used by a CAD tool executing on computer system 30 and the violations may be displayed for a layout designer within layout block 54 on display device 36.

At step 98, a DRF tool may automatically correct the design rule violation in the mask layout file. In one embodiment, the DRF tool may move all polygons associated with the design rule violation in order to increase the space between the polygons or the dimensions of the polygons associated with the violation. In another embodiment, the DRF tool may move only one polygon associated with the design rule violation to increase the feature dimension. In a further embodiment, the design rule violation may be caused by a feature dimension that is less than a minimum dimension in the technology file. In this example, the DRF tool may increase the feature dimension by repositioning edges of the features associated with the design rule violation.

In an additional embodiment, the DRF tool may move a polygon from one layer to another layer in order to correct the design rule violation. For example, a change to a polygon associated with a design rule violation may create a new design rule violation. If the polygons on a particular layer cannot be moved to correct the design rule violation, the DRF tool may move a polygon from its original layer to a layer above or below the original layer in order to remove the design rule violation and maintain connectivity in the mask layout file. Once the design rule violation has been removed from the mask layout file, the DRF tool determines if any polygons should be added to electrical connections in order to maintain connectivity. The addition of new polygons and the increase in distance between certain polygons may cause the size of layout block 54 to increase. The DRF tool may also reduce the size of layout block 54 by compacting the layout so that the spacing between the polygons on the same or different layers is approximately equal to the minimum spacing allowed for a specific manufacturing process. Since the compaction process uses design rules from the technology file, no design rule violations are introduced into the mask layout file.

In one embodiment, the mask layout file may be a hierarchical design. The hierarchical design may include a top level and one or more sub levels. In order to avoid the need to create the same cell multiple times, a subcell may be created and used numerous times throughout the top-level structure. The DRF tool may identify a design rule violation in one of the subcells and correct the violation in each instance of the cell. By identifying the design rule violation in one subcell, a modification to the subcell will occur in all instances of the subcell. The change occurs globally such that the DRF tool does not have to find each instance of the design rule violation in the mask layout file. Once the subcells have been corrected, the DRF tool checks the top-level structure to determine if any design rule violations are present and eliminates them. The DRF tool also verifies that the corrections in the subcells did not cause any violations in the top-level structure by compensating for the edges of the subcell. In one embodiment, layout block 54 may be a subcell located in a top-level structure within the hierarchical design.

Once the design rule violations have been removed from the layout block, a clean mask layout file is generated at step 92. The clean mask layout file may be free of design rule violations and may include the minimum spacing between polygons and minimum widths for polygons for a specific semiconductor manufacturing process. The clean mask layout file is then checked by the DRF tool to verify that the design rule violations have been eliminated at step 94. In one embodiment, the DRF tool may incrementally check the spacing between polygons and feature dimensions in the mask layout file such that the DRF tool only checks the portions of the mask layout file that were changed.

If no design rule violations are found, a layout versus schematic (LVS) tool is used to determine if there are any connectivity mismatches between the netlist and the mask layout file at step 100. The LVS tool compares logical connections in the netlist to their corresponding electrical connections in the mask layout file to identify any errors. If the LVS tool determines that connectivity errors are present in the mask layout file, an output file is generated that includes at least one connectivity error at step 102. In one embodiment, the CAD tool, such as a layout editor, executing on computer system 30 reads the output file and displays the connectivity errors for the layout designer within layout block 54 on display device 36.

At step 104, the connectivity errors may be removed from the mask layout file by using the output file. In one embodiment, a layout designer may manually correct the connectivity errors within layout 54 based on identifying marks provided by a layout editor. In this example, the layout designer may click on an error listed in the output file to load the error into the layout editor. In another embodiment, the LVS tool may automatically correct the connectivity errors in the mask layout file by using the output file. In this example, the LVS tool may remove all polygons associated with a mismatched electrical connection from the mask layout file or create a break point in the mismatched connection and remove all polygons associated with the mismatched connection between the break point and the mismatched node. Once the polygons have been removed, the LVS tool may locate the correct node in the mask layout file and determine a routing path for the matching electrical connection. The LVS tool routes the matching electrical connection in any appropriate layer (e.g., polysilicon and/or any suitable layer of metal) within the mask layout file.

Once all connectivity errors have been removed from the mask layout file, a clean mask layout file is generated at step 106. If the LVS tool determines that the mask layout file does not include any connectivity errors, a photomask data file is generated from the mask layout file at step 108. Multiple photomask data files may be generated to represent the different layers in layout block 54. For example, one photomask data file may contain information for a photomask to be used during the diffusion step of the manufacturing process and a separate photomask data file may contain information for a photomask to be used to form the polysilicon gates of an integrated circuit. At step 110, each of the photomask data files is used in a lithography tool to create a photomask for each layer of an integrated circuit. At step 112, a pellicle assembly may be mounted on the photomask to create a photomask assembly. The pellicle assembly may prevent contaminants from landing on the surface of the photomask. Once the photomask assembly is created, the photomask assembly may be used in a lithography system to image the pattern from the photomask on to a semiconductor wafer at step 114. A different photomask may be used for each layer of the integrated circuit until all layers of the integrated circuit have been fabricated on a semiconductor wafer. In one embodiment, a typical integrated circuit may be fabricated by using between approximately ten and approximately thirty photomasks.

Although the present invention has been described with respect to a specific preferred embodiment thereof, various changes and modifications may be suggested to one skilled in the art and it is intended that the present invention encompass such changes and modifications fall within the scope of the appended claims.

What is claimed is:

1. A photomask, comprising:
   a substrate; and
   a patterned layer formed on at least a portion of the substrate, the patterned layer formed using a mask pattern file created by:
      comparing a feature dimension in a mask layout file with a design rule in a technology file;
      identifying a design rule violation in more than one instances of a subcell in the mask layout file if the feature dimension is less than the design rule; and
      simultaneously correcting the design rule violation in each instance of the subcell.

2. The photomask of claim 1, further comprising the patterned layer formed by:
   determining if the feature dimension in the mask layout file is greater than the design rule in the technology file; and
   modifying the feature dimension until the feature dimension is approximately equal to the design rule.

3. The photomask of claim 1, further comprising the patterned layer formed by:
   generating a clean mask layout file that does not include the design rule violation; and
   generating the mask pattern file from the clean mask layout file.

4. The photomask of claim 1, wherein automatically correcting the design rule violation in the mask layout file comprises adjusting the feature dimension until the feature dimension is approximately equal to or greater than the design rule.

5. The photomask of claim 1, further comprising the mask layout file including first polygons that represent a first feature and second polygons that represent a second feature.

6. The photomask of claim 5, wherein automatically correcting the design rule violation in the mask layout file comprises repositioning edges of the first and second polygons in the mask layout file until the feature dimension is approximately equal to or greater than the design rule.

7. The photomask of claim 1, further comprising the patterned layer formed by:
   generating an output file that includes the design rule violation; and
   reading the output file to determine coordinates of the design rule violation in the mask layout file.

8. The photomask of claim 1, further comprising the design rule selected from a group consisting of an n-well spacing, a p-well spacing, a diffusion spacing, a polysilicon spacing, a metal spacing and a contact spacing.

9. The photomask of claim 1, further comprising the design rule selected from a group consisting of an n-well dimension, a p-well dimension, a diffusion dimension, a polysilicon dimension, a metal dimension and a contact dimension.

10. A photomask assembly, comprising:
   a pellicle assembly defined in part by a pellicle frame and a pellicle film attached thereto; and
   a photomask coupled to the pellicle assembly opposite from the pellicle film, the photomask including a patterned layer formed on a substrate, the patterned layer formed using a mask pattern file created by:
      comparing a feature dimension in a mask layout file with a design rule in a technology file;
      identifying a design rule violation in more than one instances of a subcell in the mask layout file if the feature dimension is less than the design rule; and
      simultaneously correcting the design rule violation in each instance of the subcell.

11. The photomask assembly of claim 10, further comprising the patterned layer formed by:
   determining if the feature dimension in the mask layout file is greater than the design rule in the technology file; and
   modifying the feature dimension until the feature dimension is approximately equal to the design rule.

12. The photomask assembly of claim 10, wherein automatically correcting the design rule violation in the mask layout file comprises adjusting the feature dimension until the feature dimension is approximately equal to or greater than the design rule.

13. The photomask assembly of claim 10, further comprising the patterned layer formed by:
   generating a clean mask layout file that does not include the design rule violation; and
   generating the mask pattern file from the clean mask layout file.

14. An integrated circuit formed on a semiconductor wafer, comprising:
   a plurality of interconnect layers selected from the group consisting of n-well, p-well, diffusion, polysilicon and metal; and
   a plurality of contact layers operable to provide electrical connections between the interconnect layers;
   the interconnect and contact layers formed on a semiconductor wafer using a plurality of photomasks created by:
      creating a mask layout file including more than one instances of a subcell;
      comparing a feature dimension in at least one instance of the subcell with a design rule in a technology file;
      identifying a design rule violation in the at least one instance of the subcell if the feature dimension is less than the design rule;
      simultaneously correcting the design rule violation in each instance of the subcell; and
      generating a plurality of mask pattern files from the mask layout file, the mask pattern files corresponding to the interconnect and contact layers.

15. The integrated circuit of claim 14, further comprising the interconnect and contact layers formed by:
   determining if the feature dimension in the mask layout file is greater than the design rule in the technology file; and
   modifying the feature dimension until the feature dimension is approximately equal to the design rule.

16. The integrated circuit of claim 14, wherein automatically correcting the design rule violation in the mask layout file comprises adjusting the feature dimension until the feature dimension is approximately equal to or greater than the design rule.

17. The integrated circuit of claim 14, wherein the mask layout file comprises a parent cell that includes the one or more instances of the subcell.

18. The integrated circuit of claim 14, further comprising the interconnect and contact layers formed by:
   generating an output file that includes the design rule violation; and
   reading the output file to determine coordinates of the design rule violation in the mask layout file.

19. The integrated circuit of claim 14, further comprising the design rule selected from a group consisting of an n-well spacing, a p-well spacing, a diffusion spacing, a polysilicon spacing, a metal spacing and a contact spacing.

20. The integrated circuit of claim 14, further comprising the design rule selected from a group consisting of an n-well dimension, a p-well dimension, a diffusion dimension, a polysilicon dimension, a metal dimension and a contact dimension.

* * * * *

UNITED STATES PATENT AND TRADEMARK OFFICE
CERTIFICATE OF CORRECTION

| | | |
|---|---|---|
| PATENT NO. | : 6,782,524 B2 | Page 1 of 1 |
| APPLICATION NO. | : 10/161527 | |
| DATED | : August 24, 2004 | |
| INVENTOR(S) | : Dan Rittman | |

It is certified that error appears in the above-identified patent and that said Letters Patent is hereby corrected as shown below:

On Title Page Item (63), please delete the following:
Related U.S. Application Data:
(63) Continuation-in-part of application no. 09/401,152, filed on Sep. 22, 1999, now abandoned.

In Column 1, Related Applications: Please delete lines 6 through 12.

Signed and Sealed this

Twentieth Day of March, 2007

JON W. DUDAS
*Director of the United States Patent and Trademark Office*